United States Patent [19]

Peters

[11] 4,357,554

[45] Nov. 2, 1982

[54] HEXAGONAL QUARTZ RESONATOR

[75] Inventor: Roswell D. M. Peters, Rustburg, Va.

[73] Assignee: The United States of America as represented by the Secretary of the Army, Washington, D.C.

[21] Appl. No.: 151,868

[22] Filed: May 21, 1980

[51] Int. Cl.³ .......................................... H01L 41/08
[52] U.S. Cl. .................................. 310/367; 310/361; 310/346; 310/353
[58] Field of Search ............... 310/361, 367, 353, 344, 310/346

[56] References Cited

U.S. PATENT DOCUMENTS

| | | | |
|---|---|---|---|
| 2,159,796 | 5/1939 | Hawk | 310/369 X |
| 2,635,199 | 4/1953 | Wolfskill | 310/353 X |
| 2,850,651 | 9/1958 | Hoffman | 310/353 X |
| 3,020,423 | 2/1962 | Gerber | 310/346 |
| 3,020,424 | 2/1962 | Beckman | 310/367 X |
| 3,069,572 | 12/1962 | Dick et al. | 310/353 |
| 3,339,091 | 8/1967 | Hammond | 310/346 |
| 3,774,057 | 11/1973 | Tsubouchi | 310/369 X |
| 3,792,294 | 2/1974 | Royer | 310/361 X |
| 3,931,388 | 1/1976 | Hafner et al. | 310/344 X |
| 4,216,402 | 8/1980 | Engdahl | 310/368 X |

OTHER PUBLICATIONS

"Resonators for Severe Environments", *Proceedings of the Thirty-Third Annual Frequency Control Symposium,* T. J. Lukaszek, pp. 311-321, May 30, 1979.

Force-Frequency Compensation Applied to Four-Point Mounting of AT-Cut Resonators, A. Ballato, *IEEE Transactions on Sonics and Ultrasonics,* vol. SU-25, No. 4, Jul. 1978.

*Primary Examiner*—Mark O. Budd
*Attorney, Agent, or Firm*—Nathan Edelberg; Jeremiah G. Murray; Michael C. Sachs

[57] ABSTRACT

A generally flat, relatively thin AT-cut piezoelectric resonator element structured to minimize the force-frequency effect when mounted and energized in a housing. The resonator is in the form of an equilateral hexagon with the X crystallographic axis of the crystal passing through one set of opposing corners with mounting being effected at an adjacent set of corners respectively ±60° away from the X axis which thereby results in a substantially zero frequency shift of the operating frequency.

10 Claims, 3 Drawing Figures

HEXAGONAL QUARTZ RESONATOR

The invention described herein may be manufactured and used by or for the Government for governmental purposes without the payment of any royalties thereon or therefor. The Government has rights in this invention pursuant to Contract Number DE-AC04-76DP00656 awarded by the Department of Energy, in cooperation with the Department of The Army.

CROSS REFERENCE TO RELATED APPLICATION

This application is related to an application entitled, "Resonator Configurations For Severe Environments", U.S. Ser. No. 145,180, filed on 4-30-80, in the names of Arthur Ballatto, et al., which application is also assigned to the assignee of the present invention.

BACKGROUND OF THE INVENTION

This invention relates generally to piezoelectric crystal resonators and more particularly to the configuration of an AT-cut resonator blank for minimizing the force-frequency effect when mounted in and operated in a resonator housing.

There are several different conventional piezoelectric crystals, primarily in the form of quartz resonators, used to provide accurate frequency determination, stability and precise timing. Increased use of the limited radio spectrum and the expanding mobile applications of electronic communications equipment, including sensor applications, serve to place greater demands on both the accuracy of frequency control and the magnitude of mechanical forces incident on such equipment.

Presently, almost all precise quartz resonators operate using bulk acoustic waves of the thickness shear variety. Among them is the well known singly rotated AT-cut. These thickness shear crystals or thickness mode cuts, as they are frequently called, are normally in the form of thin, circular discs, a typical example of which is shown in U.S. Pat. No. 3,931,388, entitled, "Crystal Resonator Housing Configurations", issued to Erich Hafner, et al. on Jan. 6, 1976. In such devices, the mechanical contact area of the mounting clips are purposely kept small on the edge of the crystal plate to minimize the force-frequency effect. This effect involves the relationship between stresses due to the mounting support supplied to the crystal resonator and changes in resonant frequency upon being energized. Unfortunately, the mounting geometry used in conventional crystal resonators has the capacity of translating any forces communicated between the quartz plate and the mounting supports to high stresses within the relatively small mechanical contact area which affects the operational frequency of the device. Greatly increased sensitivity due to damage of the quartz vibrator plate has been known to occur for this arrangement, particularly where shock and acceleration are part of the environment.

A variety of prior art approaches have been used to mitigate this persistent problem. For example, four points of fixation, instead of two, on the crystal resonator forming preselected mounting angles have been used. Another approach is to use double rotated cuts. However, all known arrangements with any degree of force-frequency insensitivity utilize circular plates peripherally mounted at points of limited area which inherently produces a concentration of stress at each mounting point.

It is an object of the present invention, therefore, to provide a crystal resonator which is shaped and mounted in such a way as to minimize the force-frequency effect.

A further object of the present invention is to provide a crystal which is easily mounted and properly aligned with respect to a predetermined crystallographic axis.

It is yet a further object of the present invention to provide a crystal which is particularly adapted for mounting in a ceramic resonator housing.

SUMMARY

Briefly, the present invention is directed to a plate-like resonator of piezoelectric material e.g. quartz of the AT-cut type wherein the resonator has a peripheral shape in the form of an equilateral polygon having a plurality of equally spaced corners. Preferably, the resonator is in the form of a equilateral hexagon wherein the X crystallographic axis of the piezoelectric material passes through one set of corners with at least one pair of mounting points being located at a pair of adjacent corners from the X axis whereby the force-frequency effect is minimized if not substantially eliminated.

DETAILED DESCRIPTION OF THE PREFERRED EMBODIMENT

In the aforementioned related application U.S. Ser. No. 145,180, entitled, "Resonator Configurations For Severe Environments", which is specifically incorporated herein by reference, there are disclosed several edge mounted AT-cut crystal resonator configurations for overcoming the well-recognized force-frequency effect. It was pointed out therein that for a singly rotated AT-cut specimen, there is an optimum location for mounting which produces a virtually zero frequency shift, namely being mounted along an axis which is oriented at an angle of 62° with respect to the X crystallographic axis. One such configuration disclosed comprises an irregular hexagon of unequal side length having adjacent interior angles of 118° and 124°, respectively, with the X crystallographic axis of the crystal passing perpendicularly through one pair of opposing sides or edges with the net result being that an adjacent pair of mounting edges lies perpendicular to the aforesaid axis which is oriented 62° with respect to the X crystallographic axis.

Figure 1:
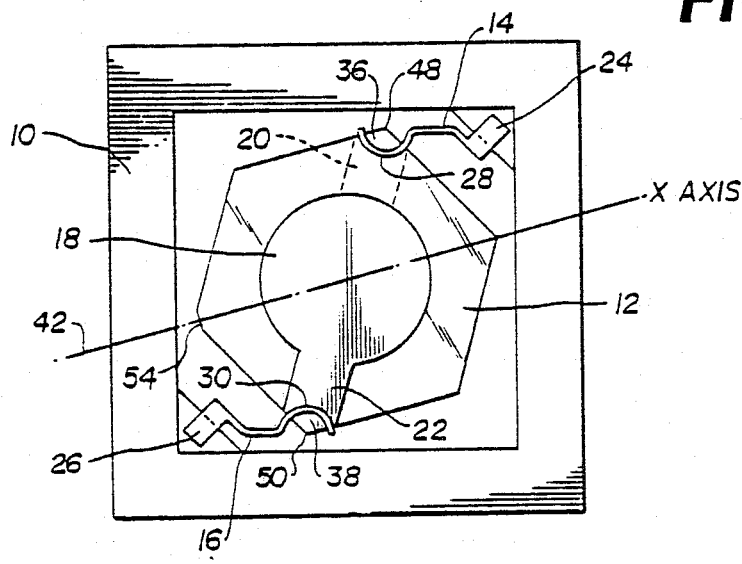
FIG. 1 is a plan view of a resonator assembly in accordance with the present invention.
Figure 3:
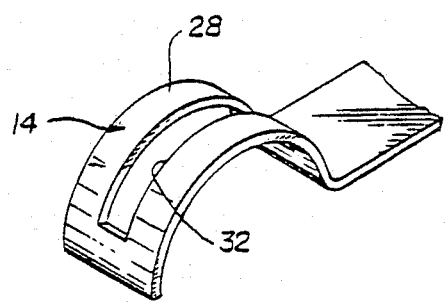
FIG. 3 is a fragmentary perspective view illustrating one type of mounting clip configuration for the crystal resonator shown in FIG. 2.

Referring now to the present invention and more particularly to FIG. 1, reference numeral 10 denotes a generally rectangular "picture frame" type of mounting structure of the type shown and described in the above cited Hafner, et al. patent, U.S. Pat. No. 3,931,388. The frame is fabricated from ceramic material such as alumina or beryllia, and exhibits the desired mechanical thermal and electrical properties for accommodating a plate-like AT-cut resonator element 12. The resonator 12 is mounted within the frame by a pair of slotted mounting clips 14 and 16, the details of which are further illustrated in FIG. 3 as it pertains to the clip 14. The resonator plate 12 includes a pair of conductive surfaces 18 on opposite faces which terminate in respective edge projecting conductive tabs 20 and 22 which make electrical contact with the mounting clips 14 and 16. The mounting clips thus not only serve to hold the resonator plate 12 in place, but also to supply externally applied electrical potential via varied metallizations, not shown, which connect to the proximal end portions 24 and 26 of the mounting clips. This type of arrangement is well known to those skilled in the art. For example, one might consider the structural details set forth in U.S. Pat. No. 2,850,651, "Piezoelectric Crystal Support", issued to P. R. Hoffman on Sept. 2, 1958 as being a typical illustration. The distal portions 28 and 30 of the clips 14 and 16 are generally semicircular in shape, having respective mounting slots, such as shown in FIG. 3 by reference numeral 32 located therein for receiving opposing corner portions 36 and 38 of the plate-like resonator 12.

Figure 2:
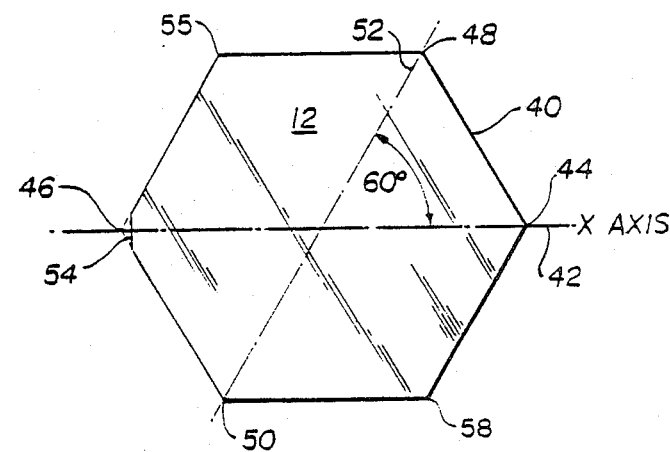
FIG. 2 is a plan view of the preferred embodiment of an AT-cut resonator crystal blank according to the subject invention.

The inventive concept of the present invention, however, lies in the structural features of the resonator plate 12 as shown in FIG. 2. The resonator is fabricated from an AT-cut quartz crystal resonator blank whose edges 40 are formed so that they describe a regular polygon preferably in the shape of an equilateral hexagon cut in such a fashion that the X crystallographic axis 42 passes through one set of opposing corners 44 and 46. With such a configuration, the adjacent set of opposing corners 48 and 50 lie along an axis 52 which is oriented ±60° with respect to the X crystallographic axis 42.

The location of the X axis 42 is further identified by means of a relatively small dimensioned edge or flat 54 formed, for example, at the corner 46. Thus by knowing the location of the X axis 42, it becomes a relatively simple matter to mount the resonator plate 12 at the corners 48 and 50 which includes the regions 36 and 38 shown in FIG. 1. Such a two point mount results in a mounting angle of 60° with respect to the X axis which results in a substantial if not minimal frequency shift of the operational frequency when the resonator is energized.

The specific configuration of the quartz resonator plate 12 as shown in FIG. 2 provides an improved method for mounting of flat resonator blanks in slotted mounting clips. In prior art applications, the mounting clips normally required deformation so that the resonators could be inserted therein. In the present invention, however, the identifying flat or edge 54, if properly dimensioned, can be utilized as the initial mounting position into the clips, with the resonator 12 then being rotated 60° until the neutral axis 52, along which the corners 48 and 50 lie, come into registration with the mounting clips 14 and 16. Since the equilateral hexagon is easily manufactured and the X axis readily identifiable, such as by use of a petrographic microscope, the resulting resonator package is a relatively simple structure, making it a highly desirable for, among other things, military applications.

It should also be pointed out that while a two point crystal mount has been shown for purposes of illustration, it should be noted that when desirable a four point mount can be resorted to depending upon the particular design requirements set forth.

Having thus shown and described what is at present considered to be the preferred embodiment of the subject invention, it is to be understood that modifications and alterations may be resorted to without departing from the spirit or scope of the invention as defined in the appended claims.

What is claimed is:

1. A plate-like resonator of piezoelectric material having a predetermined crystallographic orientation defined by at least one crystallographic axis, wherein said resonator comprises a substantially equilateral hexagon and wherein said crystallographic axis passes through one set of corners of said hexagon and said resonator includes mounting regions existing at mutually adjacent corners along a mounting axis having a ±60° angular orientation with respect to said crystallographic axis for producing a predetermined desired effect upon the resonant frequency of said mounted resonator.

2. The resonator as defined by claim 1 wherein said predetermined desired effect is substantially a zero frequency shift so that said resonator is isolated from mechanical forces and thermal effects experienced by said resonator.

3. The resonator as defined by claim 1 wherein the piezoelectric material is quartz and said predetermined cystallographic orientation comprises an AT-cut.

4. A plate-like resonator of piezoelectric material wherein said resonator describes a substantially equilateral hexagon having a plurality of equally spaced corners, having a predetermined crystallographic orientation defined by at least one crystallographic axis passing through one set of corners of said hexagon and including first and second mounting regions at mutually adjacent corners defining a mounting axis having a predetermined angular orientation of ±60° with respect to said crystallographic axis for producing a substantially zero frequency shift effect upon the resonant frequency of said resonator so that said resonator is isolated from mechanical forces and thermal effects experienced by said resonator.

5. The resonator as defined by claim 1 or 4 wherein said crystallographic axis comprises the X axis.

6. The resonator as defined by claim 5 and additionally including means at one of the corners through which said X axis passes for identifying the location of said X axis.

7. The resonator as defined by claim 6 wherein said means for identifying said X axis comrises a surface modification at the location of one of the corners through which said X axis passes.

8. The resonator as defined by claim 7 wherein said surface modification comprises a generally flat surface region at the location of said corner, said flat region having a dimension substantially less than the side dimensions of the hexagon.

9. The resonator of claim 6 wherein the said resonator is mounted by two corner clip mounts, and the resonator is installed so that no identified corner is ever mounted in either of the clip mounts.

10. The resonator of claim 9 wherein the said clip mounts also serve as means of electrically coupling energy into the said resonator.

* * * * *